(12) United States Patent
Kang et al.

(10) Patent No.: US 11,469,587 B2
(45) Date of Patent: Oct. 11, 2022

(54) OVERCURRENT PROTECTION POWER TRANSFER SWITCH

(71) Applicant: SINAENG CO.,LTD., Gunpo-si (KR)

(72) Inventors: Byung Hee Kang, Seoul (KR); Jong Chan Park, Yongin-si (KR)

(73) Assignee: SINAENG CO., LTD., Gunpo-si (KR)

( * ) Notice: Subject to any disclaimer, the term of this patent is extended or adjusted under 35 U.S.C. 154(b) by 0 days.

(21) Appl. No.: 17/258,651

(22) PCT Filed: Jul. 17, 2019

(86) PCT No.: PCT/KR2019/008816
§ 371 (c)(1),
(2) Date: Jan. 7, 2021

(87) PCT Pub. No.: WO2020/130258
PCT Pub. Date: Jun. 25, 2020

(65) Prior Publication Data
US 2021/0273440 A1 Sep. 2, 2021

(30) Foreign Application Priority Data

Dec. 19, 2018 (KR) .................. 10-2018-0165436

(51) Int. Cl.
*H02H 3/00* (2006.01)
*H02H 3/08* (2006.01)

(52) U.S. Cl.
CPC .................. *H02H 3/08* (2013.01)

(58) Field of Classification Search
CPC . H02H 3/08; Y02B 70/30; H01L 21/67; H02J 9/06

USPC ........................................... 361/101
See application file for complete search history.

(56) References Cited

U.S. PATENT DOCUMENTS

| 6,744,151 B2* | 6/2004 | Jackson | H02J 1/108 307/43 |
| 8,044,639 B2* | 10/2011 | Tamegai | H02J 7/00308 320/138 |
| 2013/0106190 A1* | 5/2013 | Lin | H02J 9/061 307/64 |
| 2013/0229060 A1 | 9/2013 | Chang et al. | |
| 2016/0233040 A1 | 8/2016 | Kim et al. | |
| 2018/0026570 A1* | 1/2018 | Cairoli | H03K 17/567 307/112 |

(Continued)

FOREIGN PATENT DOCUMENTS

| EP | 3340429 A1 * | 6/2018 | ............ H02J 3/0073 |
| JP | 4495105 B2 | 6/2010 | |

(Continued)

OTHER PUBLICATIONS

International Search Report of PCT/KR2019/008816, dated Oct. 29, 2019, English translation.

*Primary Examiner* — Jared Fureman
*Assistant Examiner* — Lucy M Thomas
(74) *Attorney, Agent, or Firm* — STIP Law Group, LLC (57) ABSTRACT

The present invention comprises a drive control unit configured such that, when a first power supply (Vin1) is abnormal, an OFF signal is simultaneously applied to the gates of first and second semiconductor switches (Q1, Q2) of a first switching element, and at the same time, an SCR switch of a second switching element and an FET bidirectional switch are turned on in order.

13 Claims, 3 Drawing Sheets

(56) References Cited

U.S. PATENT DOCUMENTS

2018/0052432 A1* 2/2018 Kim .................. G06F 1/263

FOREIGN PATENT DOCUMENTS

| KR | 20080101973 A | 11/2008 |
| KR | 20080104102 A | 12/2008 |
| KR | 20130142270 A | 12/2013 |
| KR | 20150138038 A | 12/2015 |

* cited by examiner

OVERCURRENT PROTECTION POWER TRANSFER SWITCH

CROSS-REFERENCE TO RELATED APPLICATIONS

This application is the U.S. National Phase under 35 U.S.C. § 371 of International Application No. PCT/KR2019/008816 filed on Jul. 17, 2019, which in turn claims the benefit of Korean Application No. 10-2018-0165436, filed on Dec. 19, 2018, the disclosures of which are incorporated by reference into the present application.

TECHNICAL FIELD

The present invention relates to an overcurrent protection power transfer switch, and relates to an overcurrent protection power transfer switch capable of supplying other stable power without interruption when power supplied in a semiconductor manufacturing process is unstable. More specifically, the present invention relates to an overcurrent protection power transfer switch which protects a power transfer switch from an overcurrent and supplies stable standby power without interruption when output power of an uninterruptible power supply system (UPS) supplied to semiconductor manufacturing process equipment is unstable due to a short circuit accident on the load side.

BACKGROUND ART

Various power quality problems can occur in a power system, these power quality problems can affect a working time for each semiconductor manufacturing process, and it can take time to recover the problem, and when the semiconductor manufacturing process equipment stops, since tens of thousands of semiconductor wafers in the semiconductor manufacturing process can be contaminated and discarded, enormous economic losses can be caused.

Generally, in the semiconductor manufacturing process, a main power source and a standby power source are provided so that power can be supplied from a plurality of power sources to prepare for the various power quality problems.

The main power and the standby power can be supplied from an uninterruptible power supply system or a substation of the Korea Electric Power Corporation (KEPCO), and in the semiconductor manufacturing process, the main power can be supplied from the uninterruptible power supply system, and the standby power can be supplied from the substation of KEPCO for more stable power supply, and an additional uninterruptible power supply system can be connected as the standby power source.

In the semiconductor manufacturing process, a control operation is performed by a programmable logic controller (PLC) for each piece of process equipment, and when power supplied to the PLC is unstable, since optimized production conditions of the process equipment sensitive to the power are affected, there is a problem in that the process equipment needs to be reset so that the affected production conditions are optimized again.

When power supply from main power source is unstable, a power transfer switch is used for cut-off of the power supply from the main power source and connection of power supply from the stable standby power source so that the optimized production conditions of the semiconductor manufacturing process equipment are not affected, and a conventional power transfer switch includes a relay type and a semiconductor switch type.

The relay type power transfer switch is a mechanical transfer type, and thus requires a long time of 10 ms or more, and a silicon-controlled rectifier (SCR) is used for a general semiconductor switch type power transfer switch used in semiconductor manufacturing process equipment. Since the SCR can be switched at high speed, but a commutation time is required to prevent a short circuit due to simultaneous connection of both the main power and the standby power without cut-off of the main power during asynchronous transfer, there are problems in that an instantaneous power failure of 10 ms occurs, a load current for commutation sensing and a voltage detection algorithm are required, and a mean time between failure (MTBF) decreases due to an increase of system control complexity.

A metal oxide semiconductor field effect transistor (MOSFET) can be used as a power transfer switch which operates at high speed compared to the conventional relay type power transfer switch and the power transfer switch using the SCR, and in a case of a short circuit accident at a load terminal, when a current peak value at the load terminal rises, and thus the main power is cut off and the standby power is connected, an overcurrent flows to the power transfer switch for connecting the standby power.

However, there is a problem in that the power transfer switch using the MOSFET can burn out when the overcurrent flows, or an Off operation cannot be performed due to a short circuit between a source and a drain of the MOSFET.

A power transfer switch of Laid-Open Patent Application No. 10-2008-0104102 is configured by connecting a switch using an SCR and a switch using a relay in parallel to prevent the power transfer switch from burning out in a case of a short circuit accident at a load terminal, but there is a problem in that a little more time is required to disconnect the connection between the SCR switch and the relay switch in both a case in which main power is switched to auxiliary power and a case in which the auxiliary power is switched to the main power and thus the switching operation cannot be performed at high speed.

Although a power transfer switch of Laid-Open Patent Application No. 10-2008-0101973 is configured by connecting a switch using a MOSFET and a switch using a relay in parallel to transfer direct current power, since the switch using a MOSFET and the switch using a relay are sequentially turned on for DC power connection, high-speed connection can be performed. However, there is a problem in that the overcurrent flows through the switch using a MOSFET, and thus the switch using a MOSFET burns out or an Off operation does not work when the switch using a MOSFET is turned on in the case in which the main power is switched to the standby power while a current peak value at a load terminal is rising, and since the switch using a relay should be cut off and then the switch using a MOSFET should be cut off to cut off the connection of the standby power, there is a problem in that a little more time is required to disconnect the switch using a relay and thus the switching operation cannot be performed at high speed.

DISCLOSURE

Technical Problem

The present invention is directed to providing a power transfer switch capable of operating at high speed to supply stable standby power without interruption when output power of an uninterruptible power supply system (UPS) supplied to semiconductor manufacturing process equipment is unstable.

Further, the present invention is directed to providing a power transfer switch capable of operating at high speed to supply stable standby power without interruption to the other loads even when a short circuit accident occurs in at least one load among a plurality of loads connected in parallel.

In addition, the present invention is directed to providing an overcurrent protection power transfer switch capable of operating at high speed to supply standby power without interruption even when a short circuit accident occurs in at least one load among a plurality of loads connected in parallel and thus an overcurrent occurs.

In addition, the present invention is directed to preventing an increase of system control complexity and thus preventing a decrease of a mean time between failure (MTBF) as main power is cut off and standby power is connected during asynchronous transfer and thus a load current for sensing commutation and a voltage detection algorithm to prevent the main power and the standby power from being shorted-circuited are not required.

In addition, the present invention is directed to providing an ultra-small high-speed transfer switch which is connected in a decentralized transfer switch method in a range of less than roughly 10 [A] of a rated current of an electromagnetic contactor in a PLC distribution board of semiconductor process equipment unlike a conventional centralized type transfer switch.

In addition, the present invention is directed to adopting a heat dissipation system based on a natural convection cooling method to remove a cooling fan and facilitate maintenance.

Problems to be solved by the present invention are not limited to the above-described purposes, and other technical problems not mentioned above may be easily understood by those skilled in the art through following configurations and actions of the present invention.

Technical Solution

The present invention includes the following configurations to solve the problems.

One aspect of the present invention provides an overcurrent protection power transfer switch including a first switching element configured to supply power supplied from a first power supply (Vin1) without interruption and a second switching element configured to supply power supplied from a second power supply (Vin2) without interruption, wherein the first switching element includes a field effect transistor (FET) bidirectional switch, the second switching element includes an FET bidirectional switch, and a silicon-controlled rectifier (SCR) switch which are connected in parallel, the FET bidirectional switch includes a first semiconductor switch (Q1) and a second semiconductor switch (Q2), a source of the first semiconductor switch (Q1) and a source of the second semiconductor switch (Q2) are connected to each other, diodes (D1 and D2) are respectively connected in reverse parallel to the sources and drains of the first semiconductor switch (Q1) and the second semiconductor switch (Q2), and a drive control unit, which allows an Off signal to be simultaneously applied to gates of the first and second semiconductor switches (Q1 and Q2) of the first switching element, and at the same time, allows the SCR switch and the FET bidirectional switch of the second switching element to be sequentially turned on when the first power supply (Vin1) is abnormal, is included.

In the present invention, the drive control unit may allow the SCR switch and the FET bidirectional switch of the second switching element to be sequentially turned on and then the SCR switch to be turned off and the FET bidirectional switch to be maintained in the turned-on state.

In the present invention, the second switching element may further include a relay switch so that the relay switch may be connected to the FET bidirectional switch and the SCR switch of the second switching element in parallel, and the drive control unit may allow the Off signal to be simultaneously applied to the gates of the first and second semiconductor switches (Q1 and Q2) of the first switching element, and at the same time, allow the SCR switch, the relay switch, and the FET bidirectional switch of the second switching element to be sequentially turned on when the first power supply (Vin1) is abnormal.

In the present invention, the drive control unit may allow the SCR switch, the relay switch, and the FET bidirectional switch of the second switching element to be sequentially turned on, and then the SCR switch and the relay switch to be turned off and the FET bidirectional switch to be maintained in the turned-on state.

In the present invention, the FET bidirectional switch of the first switching element may be turned on, and at the same time, the FET bidirectional switch of the second switching element may be turned off when the first power supply (Vin1) is normal for a predetermined time or more or release of the overcurrent is sensed in a state in which the FET bidirectional switch of the second switching element is maintained in the turned-on state and thus power is supplied from the second power supply (Vin2) to an output side.

In the present invention, at least two or more first switching elements may be provided, one first switching element may be connected between a first terminal of the first power supply (Vin1) and a third terminal at an output side, and another first switching element may be connected between a second terminal of the first power supply (Vin1) and a fourth terminal at the output side.

In the present invention, at least two or more second switching elements may be provided, one second switching element may be connected between a first terminal of the second power supply (Vin2) and the third terminal at the output side, and another second switching element may be connected between a second terminal of the second power supply (Vin2) and the fourth terminal at the output side.

In the present invention, the first and second semiconductor switches (Q1 and Q2) may be metal oxide semiconductor field effect transistors (MOSFET) or insulated gate bipolar transistors (IGBT).

In the present invention, an interlock circuit configured to prevent simultaneous application of an On signal to the first switching element and the second switching element may be connected to the drive control unit.

Further, another aspect of the present invention provides a switching method of an overcurrent protection power transfer switch including a first switching element configured to supply power supplied from a first power supply (Vin1) without interruption and a second switching element configured to supply power supplied from a second power supply (Vin2) without interruption, wherein the first switching element includes an FET bidirectional switch, a second switching element includes an FET bidirectional switch and a silicon-controlled rectifier (SCR) switch which are connected in parallel, the FET bidirectional switch includes a first semiconductor switch (Q1) and a second semiconductor switch (Q2), a source of the first semiconductor switch (Q1) and a source of the second semiconductor switch (Q2) are connected to each other, and diodes (D1 and D2) are respectively connected in reverse parallel to the sources and drains of the first semiconductor switch (Q1) and the second semiconductor switch (Q2), the method including: a first operation (S100) in which drive control unit allows an Off signal to be simultaneously applied to gates of the first and second semiconductor switches (Q1 and Q2) of the first switching element, and at the same time, allows the SCR switch and the FET bidirectional switch of the second switching element to be sequentially turned on when the first power supply (Vin1) is abnormal; and a second operation (S200) in which the drive control unit allows the SCR switch to be turned off and the FET bidirectional switch to be maintained in the turned-on state after the SCR switch and the FET bidirectional switch of the second switching element are sequentially turned on in the first operation (S100).

In the present invention, the method may further include a third operation (S300) in which the FET bidirectional switch of the first switching element is turned on, and at the same time, the FET bidirectional switch of the second switching element is turned off when the first power supply (Vin1) is normal for a predetermined time or more or release of the overcurrent is sensed in a state in which the FET bidirectional switch is maintained in the turned-on state and thus power is supplied from the second power supply (Vin2) to an output side in the second operation (S200).

In the present invention, the second switching element may further include a relay switch so that the relay switch may be connected to the FET bidirectional switch and the SCR switch of the second switching element in parallel, the drive control unit may allow the Off signal to be simultaneously applied to the gates of the first and second semiconductor switches (Q1 and Q2) of the first switching element, and at the same time, allow the SCR switch, the relay switch, and the FET bidirectional switch of the second switching element to be sequentially turned on when the first power supply (Vin1) is abnormal in the first operation (S100), and the drive control unit may allow the SCR switch and the relay switch to be turned off and the FET bidirectional switch to be maintained in the turned-on state in the second operation (S200) after the SCR switch, the relay switch, and the FET bidirectional switch of the second switching element are sequentially turned on in the first operation (S100).

Further, the present invention may provide a computer program stored on a medium to execute the switching method of the overcurrent protection power transfer switch.

Advantageous Effects

In the present invention, there is an effect in that stable standby power can be supplied without interruption when output power of an uninterruptible power supply system (UPS) supplied to semiconductor manufacturing process equipment is unstable.

Further, in the present invention, there is an effect in that stable standby power can be supplied without interruption to the other loads even when a short circuit accident occurs in at least one load among a plurality of loads connected in parallel.

In addition, in the present invention, there is an effect in that stable standby power can be supplied without interruption even when a short circuit accident occurs in at least one load among a plurality of loads connected in parallel and thus an overcurrent occurs.

In addition, in the present invention, there is an effect in that an increase of system control complexity can be prevented and thus a decrease of a mean time between failure (MTBF) can be prevented as main power is cut off and standby power is connected in asynchronous transfer and thus a load current for sensing commutation and a voltage detection algorithm to prevent the main power and the standby power from being short-circuited are not required.

In addition, in the present invention, there is an effect in that an ultra-small high-speed transfer switch which is connected in a decentralized transfer switch method in a range of less than roughly 10 [A] of a rated current of an electromagnetic contactor in a PLC distribution board of semiconductor process equipment can be provided.

In addition, in the present invention, there is an effect in that a heat dissipation system based on a natural convection cooling method can be adopted to remove a cooling fan and facilitate maintenance.

Effects from the present invention are not limited to the above-described effects, and other effects not mentioned above can be easily understood by those skilled in the art through following configurations and actions of the present invention.

MODES OF THE INVENTION

Hereinafter, overall configurations and actions according to preferable embodiments of the present invention will be described. These embodiments are exemplary and do not limit the configurations and actions of the present invention, and other configurations and actions which are not clearly described in the embodiments may also be seen as the technical spirit of the present invention when easily understood by those skilled in the art through the following embodiments of the present invention.

Here, overall configurations and operations according to specific embodiments of the present invention will be described.

Figure 1:
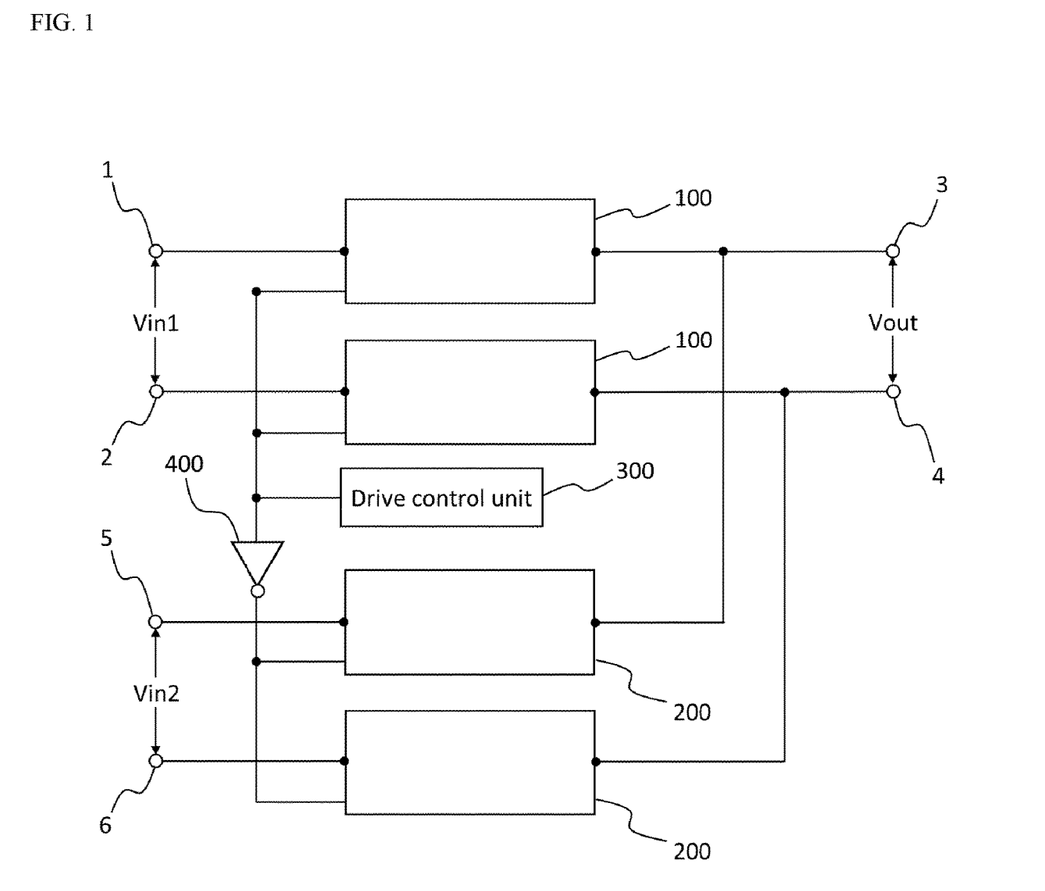
FIG. 1 schematically illustrates a configuration in which power is supplied from a redundant power supply to a load side by an overcurrent protection power transfer switch of the present invention.

FIG. 1 schematically illustrates a configuration in which power is supplied from a redundant power supply to a load side by an overcurrent protection power transfer switch of the present invention.

Referring to FIG. 1, at least one or more power transfer switches 100 may be connected through a first terminal 1 and a second terminal of a first power supply Vin1, at least one or more power transfer switches 200 may be connected through a first terminal 5 and a second terminal 6 of a second power supply Vin2, and the power transfer switch 100 and the power transfer switch 200 may operate by a drive control unit 300 and an interlock circuit 400.

The plurality of power transfer switches 100 and 200 supply an output voltage Vout from the first power supply Vin1 or the second power supply Vin2 to a load side through a third terminal and a fourth terminal, and a plurality of loads are connected to the load side in parallel.

The first power supply Vin1 and the second power supply Vin2 are a main power source and a standby power source, respectively, and are one of an uninterruptible power supply (UPS) or Korea Electric Power Corporation (KEPCO) power supply, respectively, and in semiconductor factories, the uninterruptible power supply is generally connected to the main power source and the standby power source is connected to the KEPCO power supply for stable power supply, and the uninterruptible power supply may also be connected as an additional standby power source.

Dozens of power transfer switches 100 and 200 and dozens of programmable logic controllers (PLC) may be connected to the uninterruptible power supply, and for small capacity, the power transfer switches 100 and 200 may adopt a heat dissipation system of a natural convection cooling method which does not require a heat dissipation fan.

Specifically, the power transfer switches 100 and 200 of the present invention may be operated silently by supplying a current of less than about 10 [A], which is a rated current of an electromagnetic contactor in a PLC distribution board of semiconductor process equipment, to constitute a distributed type ultra-small power transfer switch to remove a heat dissipation fan, and thus maintenance is easy as there is no need to replace the heat dissipation fan according to a lifespan of the heat dissipation fan.

In a conventional centralized type large capacity power transfer switch, due to the lifespan of the heat dissipation fan, an operation of the power transfer switch should be stopped to replace the heat dissipation fan for maintenance, and accordingly, the power supply is cut off and thus, the operation of the semiconductor process equipment should also be stopped.

Further, in the conventional centralized type large capacity power transfer switch, even when the heat dissipation fan is replaced and the operation of the power transfer switch starts, since it is required to reset the process equipment so that production conditions of the semiconductor process equipment are optimized again, and a time of several weeks is required for the above, the semiconductor process equipment should also be stopped to replace the heat dissipation fan, and thus enormous economic loss may be caused.

Meanwhile, generally, a plurality of loads, which are a plurality of pieces of semiconductor process equipment, are connected in parallel to the load sides of the power transfer switches 100 and 200 of the present invention, and when a short circuit accident occurs in any one of the plurality of loads, since the voltage of the uninterruptible power supply, which is a main power source, drops, the power supplied to the remaining loads becomes unstable.

However, even when the short circuit occurs in any one of the plurality of loads connected in parallel, there is a case in which stable power should be supplied to the remaining loads connected in parallel. In this case, when the voltage drops and thus connection of the unstable main power is cut off and the stable standby power is connected, an overcurrent flows through the power transfer switch for this connection.

Figure 4:
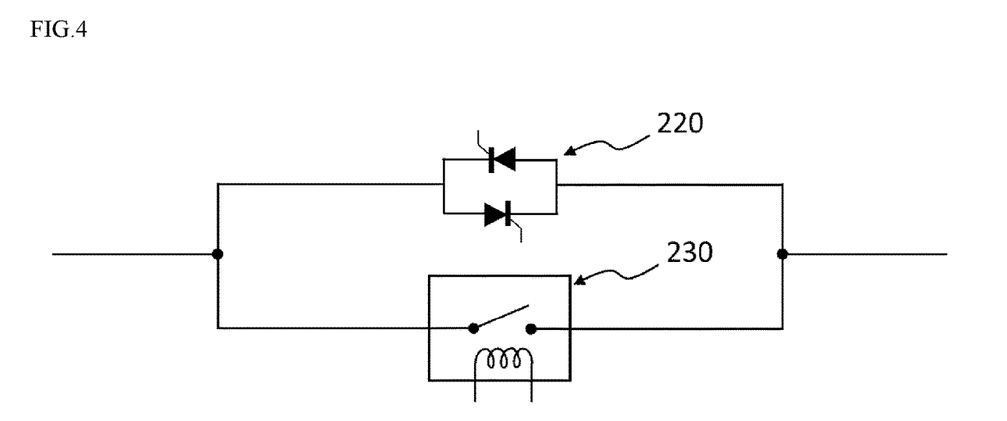
FIG. 4 illustrates a switching element in which a silicon-controlled rectifier (SCR) switch and a relay switch are connected in parallel as in the conventional art.

FIG. 4 illustrates a switching element in which a silicon-controlled rectifier (SCR) switch and a relay switch are connected in parallel as in the conventional art.

Referring to FIG. 4, the switching element in which the SCR switch and the relay switch are connected in parallel may be turned on at high speed while preventing the switching element from burning out in case of the short circuit accident at a load terminal, but an Off operation of the relay switch may not be performed at high speed.

Figure 5:
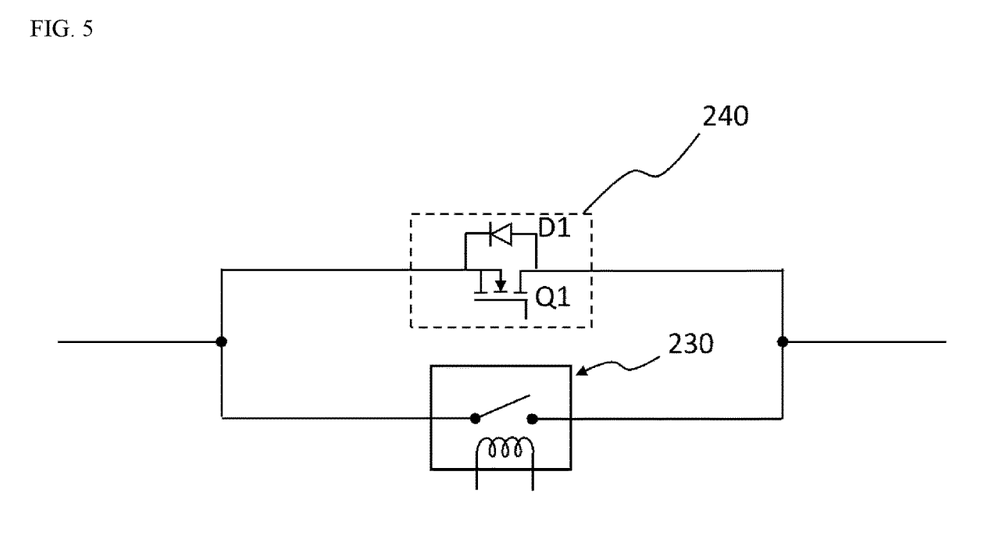
FIG. 5 illustrates a switching element in which a field effect transistor (FET) unidirectional switch and a relay switch are connected in parallel as in the conventional art.

FIG. 5 illustrates a switching element in which a field effect transistor (FET) unidirectional switch and a relay switch are connected in parallel as in the conventional art.

Referring to FIG. 5, the switching element in which the FET unidirectional switch and the relay switch are connected in parallel may be turned on at high speed, but the FET unidirectional switch may burn out or may be shorted in case of the short circuit accident at the load terminal and the Off operation of the relay switch may not be performed at high speed.

However, in the overcurrent protection power transfer switch of the present invention, an On operation and an Off operation may be performed at high speed while preventing the power transfer switch from burning out or being shorted in the case of the short circuit accident at the load terminal.

Figure 2:
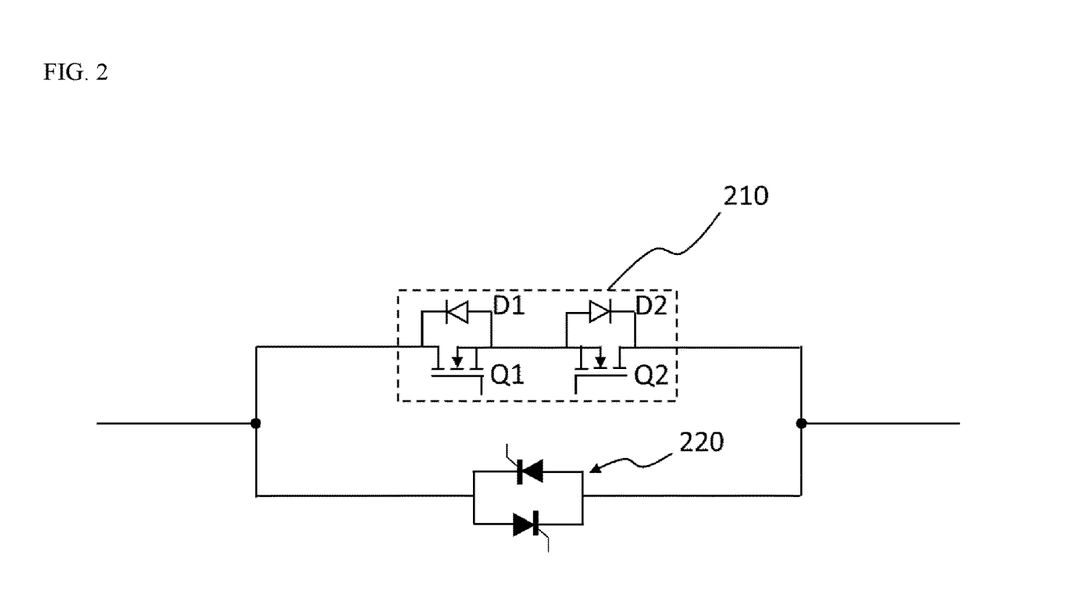
FIG. 2 illustrates one embodiment of a switching element used in the overcurrent protection power transfer switch of the present invention.

FIG. 2 illustrates one embodiment of the switching element used in the overcurrent protection power transfer switch of the present invention.

Referring to FIG. 2, the switching element used in the overcurrent protection power transfer switch of the present invention includes an FET bidirectional switch 210 and an SCR switch 220 which are connected to each other in parallel, wherein the FET bidirectional switch 210 includes a first semiconductor switch Q1 and a second semiconductor switch Q2, a source of the first semiconductor switch Q1 and a source of the second semiconductor switch Q2 are connected to each other, and diodes D1 and D2 are respectively connected in reverse parallel to the sources and drains of the first semiconductor switch Q1 and the second semiconductor switch Q2.

Two SCR thyristors are connected in reverse parallel to enable conduction of the SCR switch 220 in both directions such that an On operation may be performed by a gate signal.

One embodiment of the present invention is a case in which the switching element in FIG. 2 is used in the overcurrent protection power transfer switch in FIG. 1, and in the overcurrent protection power transfer switch including a first switching element 100 capable of supplying power supplied from the first power supply Vin1 without interruption and a second switching element 200 capable of supplying power supplied from the second power supply Vin2 without interruption, the first switching element 100 includes an FET bidirectional switch 210, and the second switching element 200 includes an FET bidirectional switch 210 and an SCR switch 220 which are connected in parallel to each other.

The FET bidirectional switch 210 includes the first semiconductor switch Q1 and the second semiconductor switch Q2, the source of the first semiconductor switch Q1 and the source of the second semiconductor switch Q2 are connected to each other, and the diodes D1 and D2 are respectively connected in reverse parallel to the sources and the drains of the first semiconductor switch Q1 and the second semiconductor switch Q2.

In the present invention, a drive control unit 300, which allows an Off signal to be simultaneously applied to gates of the first and second semiconductor switches Q1 and Q2 of the first switching element 100, and at the same time, allows the SCR switch 220 and the FET bidirectional switch 210 of the second switching element 200 to be sequentially turned on when the first power supply Vin1 is abnormal, is included.

When the first power supply Vin1 is a main power source and the second power supply Vin2 is a standby power source, the first power supply Vin1 may be the UPS and the second power supply Vin2 may be the KEPCO power supply, and in this case, the first switching element 100 may stably operate with only the FET bidirectional switch.

In a situation in which the first power supply Vin1, which is a main power source, is supplied, when the short circuit accident occurs in any one of the plurality of loads connected in parallel to the third terminal 3 and the fourth terminal 4 of the output voltage Vout, since the power supply voltage supplied to other loads connected in parallel may drop, the first power supply Vin1, which is a main power source, is cut off and the second power supply Vin2, which is a standby power source, is supplied.

Of course, in the load in which the short circuit accident occurs, measures are taken to prevent a secondary accident such as fire or the like, but this is not part of the present invention, and in the present invention, this is a case in which stable power should be supplied to other loads connected in parallel due to the characteristics of the load even when the short circuit accident of one load connected in parallel occurs.

In the case of UPS power, when the short circuit accident occurs in the load, the voltage may easily drop due to the capacity limitation, but the voltage of KEPCO power does not drop easily even when a short circuit accident occurs in the load compared to the UPS power.

The FET bidirectional switch 210 of the first switching element 100 may cut off the first power supply Vin1, which is a main power source, at high speed by performing an Off operation at high speed, and the SCR switch 220 of the second switching element 200 may supply the second power supply Vin2, which is a standby power source, by performing an On operation at high speed.

Further, the SCR switch 220 of the second switching element 200 has an advantage of performing an On operation at high speed, and being difficult to be burned out by an overcurrent which may flow due to the short circuit accident on the load side.

The second power supply Vin2, which is a standby power source, is primarily supplied by the SCR switch 220 of the second switching element 200, and when a connection is disconnected due to the overcurrent and short-circuit current flowing through the load or a fuse or a circuit breaker which is connected to the load is opened, and thus an overcurrent state is released, the FET bidirectional switch 210 of the second switching element 200 is turned on, and then the FET bidirectional switch 210 of the second switching element 200 is maintained in the turned-on state, and thus the second power supply Vin2, which is a standby power source, is supplied and the SCR switch 220 is turned off.

Since the SCR switch 220 may be turned on at high speed by the gate signal, but is difficult to be turned off at high speed, the FET bidirectional switch 210 of the second switching element 200 serves to block supply of the second power supply Vin2, which is a standby power source. That is, while the FET bidirectional switch 210 of the second switching element 200 is maintained in the turned-on state, the Off operation of the SCR switch 220 does not have to operate at high speed.

Figure 3:
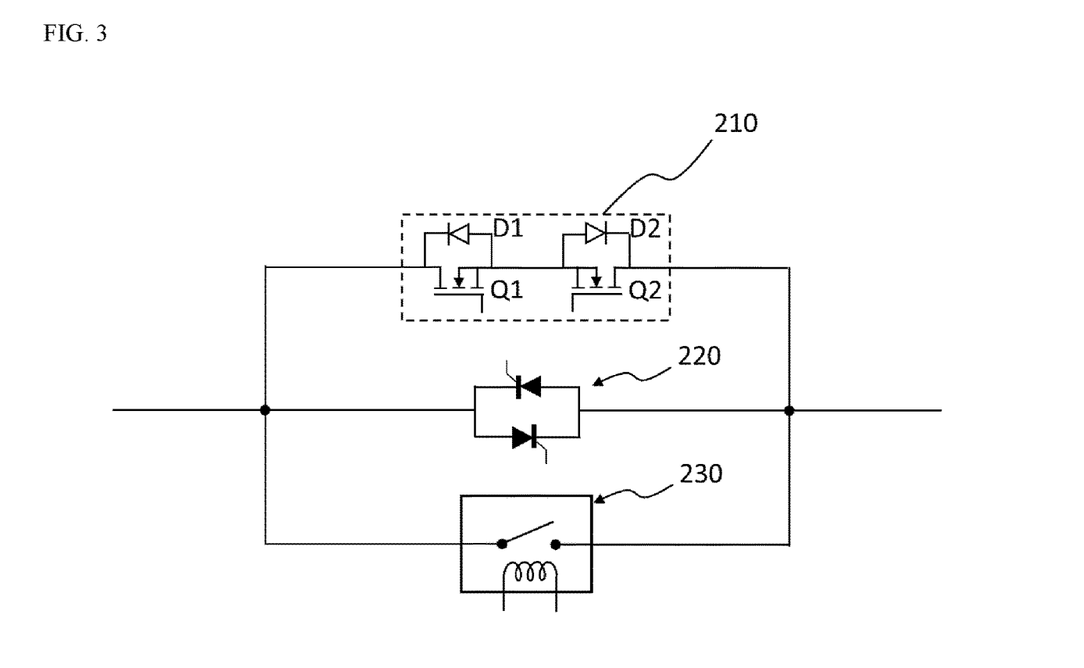
FIG. 3 illustrates another embodiment of the switching element used in the overcurrent protection power transfer switch of the present invention.

FIG. 3 illustrates another embodiment of the switching element used in the overcurrent protection power transfer switch of the present invention.

Referring to FIG. 3, a switching element used in the overcurrent protection power transfer switch of the present invention includes an FET bidirectional switch 210, an SCR switch 220, and a relay switch 230 which are connected in parallel to each other, wherein the FET bidirectional switch 210 includes a first semiconductor switch Q1 and a second semiconductor switch Q2, a source of the first semiconductor switch Q1 and a source of the second semiconductor switch Q2 are connected to each other, and diodes D1 and D2 are respectively connected in reverse parallel to sources and drains of the first semiconductor switch Q1 and the second semiconductor switch Q2.

Two SCR thyristors are connected in reverse parallel to enable conduction of the SCR switch 220 in both directions such that an On operation may be performed by a gate signal.

The relay switch 230 has an allowable current capacity larger than that of the SCR switch 220, and thus is a configuration for preparing for a larger overcurrent.

Another embodiment of the present invention is a case in which the switching element in FIG. 3 is used in the overcurrent protection power transfer switch in FIG. 1, and in the overcurrent protection power transfer switch including a first switching element 100 capable of supplying power supplied from the first power supply Vin1 without interruption and a second switching element 200 capable of supplying power supplied from the second power supply Vin2 without interruption, the first switching element 100 includes the FET bidirectional switch 210, and the second switching element 200 includes the FET bidirectional switch 210, the SCR switch 220, and the relay switch 230 which are connected in parallel to each other.

The FET bidirectional switch 210 includes the first semiconductor switch Q1 and the second semiconductor switch Q2, the source of the first semiconductor switch Q1 and the source of the second semiconductor switch Q2 are connected to each other, and the diodes D1 and D2 are respectively connected in reverse parallel to the sources and the drains of the first semiconductor switch Q1 and the second semiconductor switch Q2.

In the present invention, a drive control unit 300, which allows an Off signal to be simultaneously applied to gates of the first and second semiconductor switches Q1 and Q2 of the first switching element 100, and at the same time, allows the SCR switch 220, the relay switch 230, and the FET bidirectional switch 210 of the second switching element 200 to be sequentially turned on when the first power supply Vin1 is abnormal, is included.

The FET bidirectional switch 210 of the first switching element 100 may cut off the first power supply Vin1, which is a main power source, by performing an Off operation at high speed, and the SCR switch 220 of the second switching element 200 may supply the second power supply Vin2, which is a standby power source, by performing an On operation at high speed.

Further, the SCR switch 220 of the second switching element 200 has an advantage of performing an On operation at high speed, and being difficult to be burned out by an overcurrent which may flow due to the short circuit accident on the load side.

Since the relay switch 230 has an allowable current capacity larger than that of the SCR switch 220, and thus has an advantage of preparing for a larger overcurrent, but a disadvantage in that a high-speed operation is difficult, in consideration of this, after the On operation of the SCR switch 220 is performed at high speed, the On operation of the relay switch 230 is performed.

Accordingly, the high-speed On operation is performed by the SCR switch 220, and the relay switch 230 is responsible for the large capacity of the allowable current.

The second power supply Vin2, which is a standby power source, is primarily supplied by the SCR switch 220 and the relay switch 230 of the second switching element 200, and when a connection is disconnected due to the overcurrent and short-circuit current flowing through the load or a fuse or a circuit breaker which is connected to the load is opened, and thus an overcurrent state is released, the FET bidirectional switch 210 of the second switching element 200 is turned on, and then the FET bidirectional switch 210 of the second switching element 200 is maintained in the turned-on state, and thus the second power supply Vin2, which is a standby power source, is supplied and the SCR switch 220 and the relay switch 230 are turned off.

Since the SCR switch 220 may be turned on at high speed by the gate signal, but is difficult to be turned off at high speed, and the relay switch 230 has the large capacity of the allowable current, but is also difficult to be turned off at high speed, the FET bidirectional switch 210 of the second switching element 200 performs a turn-off operation of blocking supply of the second power supply Vin2, which is a standby power source. That is, while the FET bidirectional switch 210 of the second switching element 200 is maintained in the turned-on state, the Off operation of each of the SCR switch 220 and the relay switch 230 does not have to operate at high speed.

Accordingly, the high-speed On operation is performed by the SCR switch 220, the relay switch 230 is responsible for the large capacity of the allowable current, and a high-speed Off operation is performed by the FET bidirectional switch 210.

The drive control unit 300 allows an Off signal to be simultaneously applied to the gates of the first and second semiconductor switches Q1 and Q2 of the FET bidirectional switch 210 included in the switching element 100, and at the same time, allows an On signal to be applied to the second switching element 200 when the first power supply Vin1 is abnormal.

In this case, a little delay time is required to simultaneously apply the Off signal to the gates of the first and second semiconductor switches Q1 and Q2 of the FET bidirectional switch 210 of the switching element 100 and then actually turn off the first and second semiconductor switches Q1 and Q2, and since this is provided to prevent a short circuit of a circuit, it is preferable to apply the On signal to the second switching element 200 after the first semiconductor switch Q1 and the second semiconductor switch Q2 of the first switching element 100 are actually turned off, and this delay time is only a few us, which is negligible in the power transfer switch of the present invention having a high-speed operation time.

Likewise, a little delay time is required to apply the Off signal to the gates of the first and second semiconductor switches Q1 and Q2 of the FET bidirectional switch 210 of the second switching element 200 and then actually turn off the first and second semiconductor switches Q1 and Q2.

Further, an interlock circuit 400 may be connected to the drive control unit 300 to prevent simultaneous application of the On signal to the first switching element 100 and the second switching element 200.

Although not shown in the drawings, a power sensing part is provided to monitor whether the first power supply Vin1 and the second power supply Vin2 are abnormal, and when the first power supply Vin1 is abnormal and the second power supply Vin2 is normal, for example, when a predetermined instantaneous voltage drop occurs for a predetermined time in the first power supply Vin1 and the second power supply Vin2 is normal, a transfer operation from the first power supply Vin1 to the second power supply Vin2 is performed.

In order to sense the short circuit accident of the load, the load may be provided with a current sensing part to sense a current peak value on the load side.

Further after the transfer operation from the first power supply Vin1 to the second power supply Vin2 is performed, when the first power supply Vin1 is normal for a predetermined time or release of the overcurrent is sensed, the second power supply Vin2 is switched to the first power supply Vin1.

Accordingly, the present invention is provided to connect a redundant power supply, and since high-quality power among two or more redundant power supplies is supplied to the load, stable power is supplied to semiconductor process equipment sensitive to power fluctuations.

In more specific description of operations of the first switching element 100 and the second switching element 200 of the present invention, since the On signal or Off signal are simultaneously applied to the first semiconductor switch Q1 and the second semiconductor switch Q2 in a state in which the first semiconductor switch Q1 and the second semiconductor switch Q2 are connected in reverse series to each other, the first semiconductor switch Q1 and the second semiconductor switch Q2 are not simultaneously conductive, and power is applied to semiconductor process equipment through the diodes D1 and D2 respectively connected in reverse parallel to the sources and drains of the first semiconductor switch Q1 and the second semiconductor switch Q2.

That is, when the ON signal is simultaneously applied to the gates in the state in which the first semiconductor switch Q1 and the second semiconductor switch Q2 are connected in reverse series to each other, and when the first power supply Vin1, which is an AC power source, becomes positive (+) in the state in which alternating current power is applied, the first semiconductor switch Q1 and the diode D2 are conductive, and the first power supply Vin1 applies the output voltage Vout to the third terminal 3 and the fourth terminal 4, and when the first power supply Vin1, which is an AC power source, becomes negative (−), the first power supply Vin1 applies the output voltage Vout to the third terminal 3 and the fourth terminal 4 through the diode D1 and the second semiconductor switch Q2.

When the first power supply Vin1, which is an AC power source, is not abnormal and stable power supply continues, since the first semiconductor switch Q1 and the second semiconductor switch Q2 of the first switching element 100 are maintained in the turned-on state, and thus the switching operation is not performed, frequent occurrence of a surge voltage caused by the switching operation and frequent occurrence of a voltage saturation phenomenon caused by the switching operation and the capacitive load may be prevented.

The drive control unit 300 performs a first operation S100 in which the Off signal is simultaneously applied to the gates of the first and second semiconductor switches Q1 and Q2 of the first switching element 100, and at the same time, the SCR switch 220 and the FET bidirectional switch 210 of the second switching element 200 are sequentially turned on when the power supplied from the first power supply Vin1 to the semiconductor process equipment side is abnormal The drive control unit 300 performs a second operation S200 in which the SCR switch 220 is turned off and the FET bidirectional switch 210 is maintained in the turned-on state after the SCR switch 220 and the FET bidirectional switch 210 of the second switching element 200 are sequentially turned on in the first operation S100.

The second power supply Vin2, which is a standby power source, is primarily supplied by the SCR switch 220 of the second switching element 200, and when a connection is disconnected due to the overcurrent and short-circuit current flowing through the load or a fuse or a circuit breaker which is connected to the load is opened, and thus an overcurrent state is released, the FET bidirectional switch 210 of the second switching element 200 is turned on, and then the FET bidirectional switch 210 of the second switching element 200 is maintained in the turned-on state, and thus the second power supply Vin2, which is a standby power source, is supplied and the SCR switch 220 is turned off.

The drive control unit 300 performs a third operation S300 in which the FET bidirectional switch 210 of the first switching element 100 is turned on and, at the same time, the FET bidirectional switch 210 of the second switching element 200 is turned off when the first power supply Vin1 is normal for a predetermined time or more or the release of the overcurrent is sensed in the state of the second operation S200 in which the FET bidirectional switch 210 is maintained in the turned-on state and thus the power is supplied from the second power supply Vin2 to an output side.

After the power supplied to the semiconductor process equipment side from the first power supply Vin1, which is an AC power source, is cut off and the power supplied to the semiconductor process equipment side from the second power supply Vin2, which is an AC power source, is connected, the drive control unit 300 allows the On signal to be simultaneously applied to the gates of the first and second semiconductor switches Q1 and Q2 of the first switching element 100, and at the same time, allows the Off signal to be simultaneously applied to the gates of the first and second semiconductor switches Q1 and Q2 of the second switching element 200 when the power supplied to the semiconductor process equipment side from the first power supply Vin1, which is an AC power source, is normal for a predetermined time or more or the release of the overcurrent is sensed.

Further, since the second switching element 200 of the present invention further includes the relay switch 230, the relay switch 230 may be connected to the FET bidirectional switch 210 and the SCR switch 220 of the second switching element 200 in parallel.

When the second switching element 200 of the present invention further includes the relay switch 230, in the first operation S100, the drive control unit 300 allows the Off signal to be simultaneously applied to the gates of the first and second semiconductor switches Q1 and Q2 of the first switching element 100, and at the same time, allows the SCR switch 220, the relay switch 230, and the FET bidirectional switch 210 of the second switching element 200 to be sequentially turned on when the power supplied from the first power supply Vin1 is abnormal, and in the second operation S200, the drive control unit 300 turns off the SCR switch 220 and the relay switch 230 and maintains the FET bidirectional switch 210 in the turned-on state after the SCR switch 220, the relay switch 230, and the FET bidirectional switch 210 of the second switching element 200 are sequentially turned on in the first operation S100.

The second power supply Vin2, which is a standby power source, is primarily supplied by the SCR switch 220 and the relay switch 230 of the second switching element 200, and when a connection is disconnected due to the overcurrent and short-circuit current flowing through the load or a fuse or a circuit breaker which is connected to the load is opened, and thus an overcurrent state is released, the FET bidirectional switch 210 of the second switching element 200 is turned on, and then the FET bidirectional switch 210 of the second switching element 200 is maintained in the turned-on state, and thus the second power supply Vin2, which is a standby power source, is supplied and the SCR switch 220 and the relay switch 230 are turned off.

In the present invention, since the On signal or Off signal is simultaneously applied to the gates of the first and second semiconductor switches Q1 and Q2 of the first switching element 100, the first switching element 100 is bidirectionally conductive, and thus a problem of a reverse current from the load to the power source may occur, but generally, since the power source is separately provided with a configuration which prevents the reverse current, the reverse current generated from the load is not a problem in the present invention.

However, in the present invention, in the case in which the ON signal is applied to the first switching element 100, and at the same time, the Off signal is applied to the second switching element 200 in a state in which the first power supply Vin1 and the second power supply Vin2 are not synchronized, a case in which the first power supply Vin1 and the second power supply Vin2 are shorted may occur when a delayed load is connected.

To prevent this, in the preferable embodiment of the present invention, at least two or more first switching elements 100 are provided, one first switching element 100 is connected between the first terminal 1 of the first power supply Vin1 and the third terminal 3 at the semiconductor process equipment side, and another first switching element 100 is connected between the second terminal 2 of the first power supply Vin1 and the fourth terminal 4 at the semiconductor process equipment side.

At least two or more second switching elements 200 are also provided, one second switching element 200 is connected between the first terminal 5 of the second power supply Vin2 and the third terminal 3 at the semiconductor process equipment side, and another second switching element 200 is connected between the second terminal 6 of the second power supply Vin2 and the fourth terminal 4 at the semiconductor process equipment side.

Accordingly, in the present invention, unlike a static transfer switch (STS) type power transfer switch which is a conventional semiconductor switch type power transfer switch using a silicon-controlled rectifier (SCR), a commutation time which prevents a short circuit even during transfer switching is not required, and accordingly, since a load current for sensing commutation and a voltage detection algorithm are not necessary, and system control complexity decreases, a mean time between failure (MTBF) increases.

Further, in the present invention, the On signal may be applied to the first switching element 100, and at the same time, the Off signal may be applied to the second switching element 200 in both the case in which the first power supply Vin1 and the second power supply Vin2 are synchronized and the case in which the first power supply Vin1 and the second power supply Vin2 are not synchronized.

Meanwhile, in the present invention, since the first and second semiconductor switches Q1 and Q2 of the FET bidirectional switch 210 used in each of the first switching element 100 and the second switching element 200 are configured as metal oxide semiconductor field effect transistors (MOSFET) or insulated gate bipolar transistors (IGBT) and thus a response time may be operated in several microseconds or less, when the On signal and the Off signal are applied to the gates, the first and second semiconductor switches Q1 and Q2 may be immediately turned off within the response time of the several microseconds or less when the Off signal is applied to the gates of the first and second semiconductor switches Q1 and Q2.

Further, in the present invention, since the first and second semiconductor switches Q1 and Q2 used in the FET bidirectional switch 210 of each of the first switching element 100 and the second switching element 200 are configured as the metal oxide semiconductor field effect transistors (MOSFET) or the insulated gate bipolar transistors (IGBT), a transfer operation in which the Off signal is applied to the gate of the first switching element 100, and at the same time, the On signal is applied to the gate of the second switching element 200 may be performed, and on the other hand, a transfer operation in which the On signal is applied to the gate of the first switching element 100, and at the same time, the Off signal is applied to the gate of the second switching element 200 may be performed.

Accordingly, since the FET bidirectional switch 210 performs the high-speed Off operation, the SCR switch 220 performs the high-speed On operation, and the SCR switch 220 or the relay switch 230 is responsible for the large capacity of the allowable current, the power transfer switch of the present invention may operate at high speed and stably operate even when the overcurrent flows.

Further, a power semiconductor having a switching characteristic in which on and off control may be performed, that is, a power semiconductor in which the response time may be operated in the several microseconds or less when an On signal and an Off signal are applied to the gates may be used for the FET bidirectional switch 210 of the present invention in addition to the metal oxide semiconductor field effect transistors (MOSFET) or the insulated gate bipolar transistors (IGBT)

In addition, the diodes D1 and D2 are respectively connected in reverse parallel to the first and second semiconductor switches Q1 and Q2 configured as the metal oxide semiconductor field effect transistors (MOSFET) or the insulated gate bipolar transistors (IGBT), and in the case of the metal oxide semiconductor field effect transistor (MOSFET), since parasitic diodes connected in reverse parallel are already formed in the MOSFET, the parasitic diodes may operate as the diodes D1 and D2 which are connected in reverse parallel.

REFERENCE NUMERALS 1, 2: first terminal and second terminal of first power supply Vin1

3, 4: third terminal and fourth terminal of output voltage Vout 5, 6: first terminal and second terminal of second power supply Vin2

100: first switching element 200: second switching element

210: FET bidirectional switch 220: SCR switch

230: relay switch 240: FET unidirectional switch

300: drive control unit 400: interlock circuit

Q1: first semiconductor switch, Q2: second semiconductor switch

D1, D2: diode

The invention claimed is:

1. An overcurrent protection power transfer switch comprising
a first switching element configured to supply power supplied from a first power supply (Vin1) without interruption;
a second switching element configured to supply power supplied from a second power supply (Vin2) without interruption,
wherein
the first switching element includes a field effect transistor (FET) bidirectional switch,
the second switching element includes an FET bidirectional switch and a silicon-controlled rectifier (SCR) switch which are connected in parallel,
the FET bidirectional switch includes a first semiconductor switch (Q1) and a second semiconductor switch (Q2),
a source of the first semiconductor switch (Q1) and a source of the second semiconductor switch (Q2) are connected to each other,
diodes (D1 and D2) are respectively connected in reverse parallel to the sources and drains of the first semiconductor switch (Q1) and the second semiconductor switch (Q2); and
a drive control unit configured to allows an Off signal to be simultaneously applied to gates of the first and second semiconductor switches (Q1 and Q2) of the first switching element, and at the same time, to allows the SCR switch and the FET bidirectional switch of the second switching element to be sequentially turned on in the order of the SCR switch and the FET bidirectional switch of the second switching element when the first power supply (Vin1) is abnormal.

2. The overcurrent protection power transfer switch of claim 1, wherein the drive control unit allows the SCR switch and the FET bidirectional switch of the second switching element to be sequentially turned on in the order of the SCR switch and the FET bidirectional switch of the second switching element, and then allows the SCR switch to be turned off and the FET bidirectional switch to be maintained in the turned-on state.

3. The overcurrent protection power transfer switch of claim 2, wherein the FET bidirectional switch of the first switching element is turned on, and at the same time, the FET bidirectional switch of the second switching element is turned off when the first power supply (Vin1) is normal for a predetermined time or more or release of an overcurrent is sensed in a state in which the FET bidirectional switch of the second switching element is maintained in the turned-on state and thus power is supplied from the second power supply (Vin2) to an output side.

4. The overcurrent protection power transfer switch of claim 1, wherein:
the second switching element further includes a relay switch so that the relay switch is connected to the FET bidirectional switch and the SCR switch of the second switching element in parallel; and
the drive control unit allows the Off signal to be simultaneously applied to the gates of the first and second semiconductor switches (Q1 and Q2) of the first switching element, and at the same time, allows the SCR switch, the relay switch, and the FET bidirectional switch of the second switching element to be sequentially turned in the order of the SCR switch, the relay switch, and the FET bidirectional switch of the second switching element on when the first power supply (Vin1) is abnormal.

5. The overcurrent protection power transfer switch of claim 4, wherein the drive control unit allows the SCR switch, the relay switch, and the FET bidirectional switch of the second switching element to be sequentially turned on in the order of the SCR switch, the relay switch, and the FET bidirectional switch of the second switching element, and then allows the SCR switch and the relay switch to be turned off and the FET bidirectional switch to be maintained in the turned-on state.

6. The overcurrent protection power transfer switch of claim 1, wherein:
at least two or more first switching elements are provided;
one first switching element is connected between a first terminal of the first power supply (Vin1) and a third terminal at an output side; and
another first switching element is connected between a second terminal of the first power supply (Vin1) and a fourth terminal at the output side.

7. The overcurrent protection power transfer switch of claim 6, wherein:
at least two or more second switching elements are provided;
one second switching element is connected between a first terminal of the second power supply (Vin2) and the third terminal at the output side; and
another second switching element is connected between a second terminal of the second power supply (Vin2) and the fourth terminal at the output side.

8. The overcurrent protection power transfer switch of claim 1, wherein the first and second semiconductor switches (Q1 and Q2) are metal oxide semiconductor field effect transistors (MOSFET) or insulated gate bipolar transistors (IGBT).

9. The overcurrent protection power transfer switch of claim 1, wherein an interlock circuit configured to prevent simultaneous application of an On signal to the first switching element and the second switching element is connected to the drive control unit.

10. A switching method of an overcurrent protection power transfer switch including a first switching element configured to supply power supplied from a first power supply (Vin1) without interruption and a second switching element configured to supply power supplied from a second power supply (Vin2) without interruption, wherein the first switching element includes a field effect transistor (FET) bidirectional switch, the second switching element includes an FET bidirectional switch, and a silicon-controlled rectifier (SCR) switch which are connected in parallel, the FET bidirectional switch includes a first semiconductor switch (Q1) and a second semiconductor switch (Q2), a source of the first semiconductor switch (Q1) and a source of the second semiconductor switch (Q2) are connected to each other, and diodes (D1 and D2) are respectively connected in reverse parallel to the sources and drains of the first semiconductor switch (Q1) and the second semiconductor switch (Q2), the method comprising:
a first operation (S100) in which a drive control unit allows an Off signal to be simultaneously applied to gates of the first and second semiconductor switches (Q1 and Q2) of the first switching element, and at the same time, allows the SCR switch and the FET bidirectional switch of the second switching element to be sequentially turned on in the order of the SCR switch and the FET bidirectional switch of the second switching element when the first power supply (Vin1) is abnormal; and
a second operation (S200) in which the drive control unit allows the SCR switch to be turned off and the FET bidirectional switch to be maintained in the turned-on state after the SCR switch and the FET bidirectional switch of the second switching element are sequentially turned on in the first operation (S100) in the order of the SCR switch and the FET bidirectional switch of the second switching element.

11. The method of claim 10, further comprising a third operation (S300) in which the FET bidirectional switch of the first switching element is turned on, and at the same time, the FET bidirectional switch of the second switching element is turned off when the first power supply (Vin1) is normal for a predetermined time or more or release of an overcurrent is sensed in a state in which the FET bidirectional switch is maintained in the turned-on state and thus power is supplied from the second power supply (Vin2) to an output side in the second operation (S200).

12. The method of claim 11, wherein:
the second switching element further includes a relay switch so that the relay switch is connected to the FET bidirectional switch and the SCR switch of the second switching element in parallel;
the drive control unit allows the Off signal to be simultaneously applied to the gates of the first and second semiconductor switches (Q1 and Q2) of the first switching element, and at the same time, allows the SCR switch, the relay switch, and the FET bidirectional switch of the second switching element to be sequentially turned on in the order of the SCR switch, the relay switch, and the FET bidirectional switch of the second switching element when the first power supply (Vin1) is abnormal in the first operation (S100); and
the drive control unit allows the SCR switch and the relay switch to be turned off and the FET bidirectional switch to be maintained in the turned-on state in the second operation (S200) after the SCR switch, the relay switch, and the FET bidirectional switch of the second switching element are sequentially turned on in the first operation (S100) in the order of the SCR switch, the relay switch, and the FET bidirectional switch of the second switching element.

13. A computer program stored on a non-transitory medium to execute the switching method of the overcurrent protection power transfer switch in claim 10.

* * * * *